United States Patent [19]
Baliga

[11] Patent Number: 5,998,833
[45] Date of Patent: Dec. 7, 1999

[54] POWER SEMICONDUCTOR DEVICES HAVING IMPROVED HIGH FREQUENCY SWITCHING AND BREAKDOWN CHARACTERISTICS

[75] Inventor: Bantval Jayant Baliga, Raleigh, N.C.

[73] Assignee: North Carolina State University, Raleigh, N.C.

[21] Appl. No.: 09/178,845

[22] Filed: Oct. 26, 1998

[51] Int. Cl.[6] .......................... H01L 29/76; H01L 29/94; H01L 31/062; H01L 31/113; H01L 27/095

[52] U.S. Cl. ...................... 257/329; 257/330; 257/333; 257/339; 257/476

[58] Field of Search .................................. 257/565, 328, 257/329, 330, 331, 332, 333, 334, 339, 488, 471, 476

[56] References Cited

U.S. PATENT DOCUMENTS

| | | | |
|---|---|---|---|
| 3,849,789 | 11/1974 | Cordes et al. | 357/15 |
| 4,646,115 | 2/1987 | Shannon et al. | 357/15 |
| 4,941,026 | 7/1990 | Temple | 357/23.4 |
| 5,111,253 | 5/1992 | Korman et al. | 257/471 |
| 5,126,807 | 6/1992 | Baba et al. | 357/23.4 |
| 5,132,753 | 7/1992 | Chang et al. | 357/23.4 |
| 5,233,215 | 8/1993 | Baliga | 257/490 |
| 5,246,870 | 9/1993 | Merchant | 437/21 |
| 5,283,201 | 2/1994 | Tsang et al. | 437/31 |
| 5,298,442 | 3/1994 | Bulucea et al. | 437/40 |
| 5,323,040 | 6/1994 | Baliga | 257/332 |
| 5,365,102 | 11/1994 | Mehrotra et al. | 257/475 |
| 5,396,085 | 3/1995 | Baliga | 257/77 |
| 5,424,231 | 6/1995 | Yang | 437/40 |
| 5,578,851 | 11/1996 | Hshieh et al. | 257/333 |
| 5,612,567 | 3/1997 | Baliga | 257/475 |
| 5,637,898 | 6/1997 | Baliga | 257/330 |
| 5,661,322 | 8/1997 | Williams et al. | 257/331 |
| 5,674,766 | 10/1997 | Darwish et al. | 437/40 |
| 5,679,966 | 10/1997 | Baliga et al. | 257/139 |
| 5,688,725 | 11/1997 | Darwish et al. | 438/270 |
| 5,731,627 | 3/1998 | Seok | 257/630 |
| 5,742,076 | 4/1998 | Sridevan et al. | 257/77 |
| 5,744,994 | 4/1998 | Williams | 327/374 |
| 5,753,938 | 5/1998 | Thapar et al. | 257/77 |

FOREIGN PATENT DOCUMENTS

0 580 452 A1   1/1994   European Pat. Off. ............... 257/329

*Primary Examiner*—Steven H. Loke
*Attorney, Agent, or Firm*—Myers Bigel Sibley & Sajovec

[57] ABSTRACT

Integrated power semiconductor devices having improved high frequency switching performance, improved edge termination characteristics and reduced on-state resistance include GD-UMOSFET unit cells with upper trench-based gate electrodes and lower trench-based source electrodes. The use of the trench-based source electrode instead of a larger gate electrode reduces the gate-to-drain capacitance ($C_{GD}$) of the UMOSFET and improves switching speed by reducing the amount of gate charging and discharging current that is needed during high frequency operation.

45 Claims, 10 Drawing Sheets

POWER SEMICONDUCTOR DEVICES HAVING IMPROVED HIGH FREQUENCY SWITCHING AND BREAKDOWN CHARACTERISTICS

FIELD OF THE INVENTION

The present invention relates to semiconductor switching devices, and more particularly to switching devices for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type base region (also referred to as "channel region") in response to the application of a positive gate bias. The inversion layer electrically connects the N-type source and drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop across power MOSFETs increases with increasing temperature, thereby promoting an even current distribution in parallel connected devices.

In view of these desirable characteristics, many variations of power MOSFETs have been designed. Two popular types are the double-diffused MOSFET device (DMOSFET) and the UMOSFET device. These and other power MOSFETs are described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into the N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Conventional UMOSFETs*, IEEE Transactions on Electron Devices, Vol. 41, No. 5, May (1994). As described by Syau et al., specific on-resistances in the range of 100–250 $\mu\Omega$cm$^2$ were experimentally demonstrated for devices capable of supporting a maximum of 25 volts. However, the performance of these devices was limited by the fact that the forward blocking voltage must be supported across the gate oxide at the bottom of the trench.

FIG. 1, which is a reproduction of FIG. 1(d) from the aforementioned Syau et al. article, discloses a conventional UMOSFET structure. In the blocking mode of operation, this UMOSFET supports most of the forward blocking voltage across the N-type drift layer which must be doped at relatively low levels to obtain a high maximum blocking voltage capability, however low doping levels typically increase the on-state series resistance. Based on these competing design requirements of high blocking voltage and low on-state resistance, a fundamental figure of merit for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp}=5.93\times10^{-9}(BV)^{2.5} \tag{1}$$

Thus, for a device with 60 volt blocking capability, the ideal specific on-resistance is 170 $\mu\Omega$cm$^2$. However, because of the additional resistance contribution from the base region (e.g., P-type base region in an N-channel MOSFET), reported specific on-resistances for UMOSFETs are typically much higher. For example, a UMOSFET having a specific on-resistance of 730 $\mu\Omega$cm$^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251, (1989). However, in this device a lower-than-ideal uniform doping concentration in the drift region was required to compensate for the high concentration of field lines near the bottom corner of the trench when blocking high forward voltages. U.S. Pat. Nos. 5,637,989 and 5,742,076 and U.S. application Ser. No. 08/906,916, filed Aug. 6, 1997, the disclosures of which are hereby incorporated herein be reference, also disclose popular power semiconductor devices having vertical current carrying capability.

In particular, U.S. Pat. No. 5,637,898 to Baliga discloses a preferred silicon field effect transistor which is commonly referred to as a graded-doped (GD) UMOSFET. As illustrated by FIG. 2, which is a reproduction of FIG. 3 from the '898 patent, a unit cell 100 of an integrated power semiconductor device field effect transistor may have a width "$W_c$" of 1 μm and comprise a highly doped drain layer 114 of first conductivity type (e.g., N+) substrate, a drift layer 112 of first conductivity type having a linearly graded doping concentration therein, a relatively thin base layer 116 of second conductivity type (e.g., P-type) and a highly doped source layer 118 of first conductivity type (e.g., N+). The drift layer 112 may be formed by epitaxially growing an N-type in-situ doped monocrystalline silicon layer having a thickness of 4 μm on an N-type drain layer 114 having a thickness of 100 μm and a doping concentration of greater than $1 \times 10^{18}$ cm$^{-3}$ (e.g. $1 \times 10^{19}$ cm$^{-3}$) therein. The drift layer 112 also has a linearly graded doping concentration therein with a maximum concentration of $3 \times 10^{17}$ cm$^{-3}$ at the N+/N junction with the drain layer 114, and a minimum concentration of $1 \times 10^{16}$ cm$^{-3}$ beginning at a distance 3 μm from the N+/N junction (i.e., at a depth of 1 μm) and continuing at a uniform level to the upper face. The base layer 116 may be formed by implanting a P-type dopant such as boron into the drift layer 112 at an energy of 100 kEV and at a dose level of $1 \times 10^{14}$ cm$^{-2}$. The P-type dopant may then be diffused to a depth of 0.5 μm into the drift layer 112. An N-type dopant such as arsenic may also be implanted at an energy of 50 kEV and at dose level of $1 \times 10^{15}$ cm$^{-2}$. The N-type and P-type dopants can then be diffused simultaneously to a depth of 0.5 μm and 1.0 μm, respectively, to form a composite semiconductor substrate containing the drain, drift, base and source layers.

A stripe-shaped trench having a pair of opposing sidewalls 120a which extend in a third dimension (not shown) and a bottom 120b is then formed in the substrate. For a unit cell 100 having a width $W_c$ of 1 μm, the trench is preferably formed to have a width "$W_t$" of 0.5 μm at the end of processing. An insulated gate electrode, comprising a gate insulating region 124 and an electrically conductive gate 126 (e.g., polysilicon), is then formed in the trench. The portion of the gate insulating region 124 extending adjacent the trench bottom 120b and the drift layer 112 may have a thickness "$T_1$" of about 2000 Å to inhibit the occurrence of high electric fields at the bottom of the trench and to provide a substantially uniform potential gradient along the trench sidewalls 120a. The portion of the gate insulating region 124 extending opposite the base layer 116 and the source layer 118 may have a thickness "$T_2$" of about 500 Å to maintain the threshold voltage of the device at about 2–3 volts. Simulations of the unit cell 100 at a gate bias of 15 Volts confirm that a vertical silicon field effect transistor having a maximum blocking voltage capability of 60 Volts and a specific on-resistance ($R_{sp,on}$) of 40 μΩcm$^2$, which is four (4) times smaller than the ideal specific on-resistance of 170 μΩcm$^2$ for a 60 volt power UMOSFET, can be achieved. Notwithstanding these excellent characteristics, the transistor of FIG. 2 may suffer from a relatively low high-frequency figure-of-merit (HFOM) if the overall gate-to-drain capacitance ($C_{GD}$) is too large. Improper edge termination of the MOSFET may also prevent the maximum blocking voltage from being achieved.

Thus, notwithstanding these attempts to develop power semiconductor devices that can be switched at high speed and have high maximum blocking voltage capability and low specific on-resistance, there still continues to be a need to develop power devices having improved electrical characteristics.

SUMMARY OF THE INVENTION

It is therefore an object of the present invention to provide integrated circuit power devices having low on-state resistance and high maximum blocking voltage capability, and methods of forming same.

It is another object of the present invention to provide integrated circuit power devices having excellent high frequency switching characteristics, and methods of forming same.

It is still another object of the present invention to provide integrated circuit power devices having reduced susceptibility to parasitic oxide breakdown.

These and other objects, advantages and features of the present invention are provided by integrated power semiconductor device which may comprise a plurality of graded-doped (GD) UMOSFET unit cells having, among other things, improved high frequency switching performance, improved edge termination characteristics and reduced on-state resistance. The preferred integrated power semiconductor devices may also include integral Schottky barrier flyback diodes and shielded gate insulating regions.

According to one embodiment of the present invention, a GD-UMOSFET is provided having an upper trench-based gate electrode and a lower trench-based source electrode. The use of the trench-based source electrode instead of a larger gate electrode which occupies the entire trench reduces the gate-to-drain capacitance ($C_{GD}$) of the UMOSFET and thereby improves switching speed by reducing the amount of gate charging and discharging current that is needed during high frequency operation. In this embodiment of an integrated power semiconductor device, a plurality of GD-UMOSFET unit cells may be provided side-by-side in a semiconductor substrate having first and second opposing faces. Source and drain regions of first conductivity type (e.g., N+) are also provided in the substrate. The source region may extend adjacent the first face and the drain region may extend adjacent the second face. A drift region of first conductivity type is also provided in the substrate. The drift region, which forms a non-rectifying junction with the drain region, may be formed as an epitaxial layer of predetermined thickness and the doping profile in the drift region may be linearly graded and decrease in a direction from the drain region to the first face. For an enhancement mode UMOSFET device, a base region of second conductivity type (e.g., P-type) is formed in the substrate. The base region extends between the source region and the drift region and forms first and second P-N junctions therewith, respectively.

A plurality of trenches are also provided in the substrate, at the first face. These trenches may be formed as parallel stripe-shaped trenches. With respect to a particular unit cell, a first trench may be provided having opposing sidewalls when viewed in transverse cross-section. One of these sidewalls preferably extends adjacent the drift region and the base region. The first trench may also have a bottom which extends opposite the drain region. In particular, the bottom of the first trench may define an interface between an interior of the first trench and the drift region or an interior of the trench and the drain region, depending on the depth of the first trench and the thickness of the drift region. A gate electrode is also provided in the first trench. This gate electrode preferably extends opposite the base region so that an inversion layer channel can be formed in the base region when an appropriate bias is applied to the gate electrode.

According to a preferred aspect of this embodiment of the present invention, a first source electrode is also provided in the first trench and this first source electrode extends between the gate electrode and the bottom of the first trench. An electrically insulating region is also provided in the first trench. This electrically insulating region extends along the sidewalls of the first trench, between the gate electrode and the first source electrode and between the first source electrode and the bottom of the trench. The inclusion of this source electrode adjacent the bottom of the first trench improves the breakdown and high frequency switching characteristics of the UMOSFET with only minimal impact on specific on-state resistance.

According to another preferred aspect of this invention, the electrically insulating region includes a gate insulating region having a first thickness (e.g., $T_2 \leq 750$ Å) as measured between the gate electrode and the sidewall of the first trench, and a source insulating region having a second thickness (e.g., $T_1 24$ 1500 Å) as measured between the first source electrode and the same sidewall. In addition, a second source electrode is provided on the first face, in ohmic contact with the source region. The first and second source electrodes are also electrically connected together.

Improved edge termination characteristics can also be achieved by forming a second trench which extends adjacent the first trench and defines an edge of the integrated power device comprising the plurality of side-by-side GD-UMOSFET unit cells. According to this aspect of the present invention, a uniformly thick first field plate insulating region is provided which lines the sidewalls and bottom of the second trench and a field plate is provided on the first field plate insulating region. This field plate is preferably connected to the source electrode or the gate electrode. In addition, a second field plate insulating region is provided on the first face and this second field plate insulating region is contiguous with the first field plate insulating region. A field plate extension is provided on the second field plate insulating region and extends opposite the first face. This field plate extension is electrically connected to the field plate in the second trench.

To improve the edge termination and breakdown characteristics of the integrated power device even further, the second trench is positioned so that the first and second trenches define a transition mesa region therebetween. However, unlike the mesa regions which may be defined between trenches within the active area of the integrated power device, the transition mesa region is preferably formed to be devoid of a source region of first conductivity type. Instead, a preferred breakdown shielding region of second conductivity type (e.g., P+) is provided which extends to the first face and forms a third P-N junction with the drift region. Here, the breakdown shielding region may be formed deeper (and more highly doped) than the base region to increase the likelihood that avalanche breakdown will occur in the transition mesa region instead of within the active area, to thereby improve device reliability. According to still further aspects of the present invention, an integrated power semiconductor device may include an integral Schottky barrier diode (SBD) along one sidewall of a trench and a GD-UMOSFET along an opposing sidewall of the trench. In particular, a Schottky rectifying junction can be formed to a uniformly doped portion of the drift region which extends adjacent the first face. This composite SBD and GD-UMOSFET is valuable for motor control and synchronous rectifier applications.

DESCRIPTION OF PREFERRED EMBODIMENTS

Figure 1:
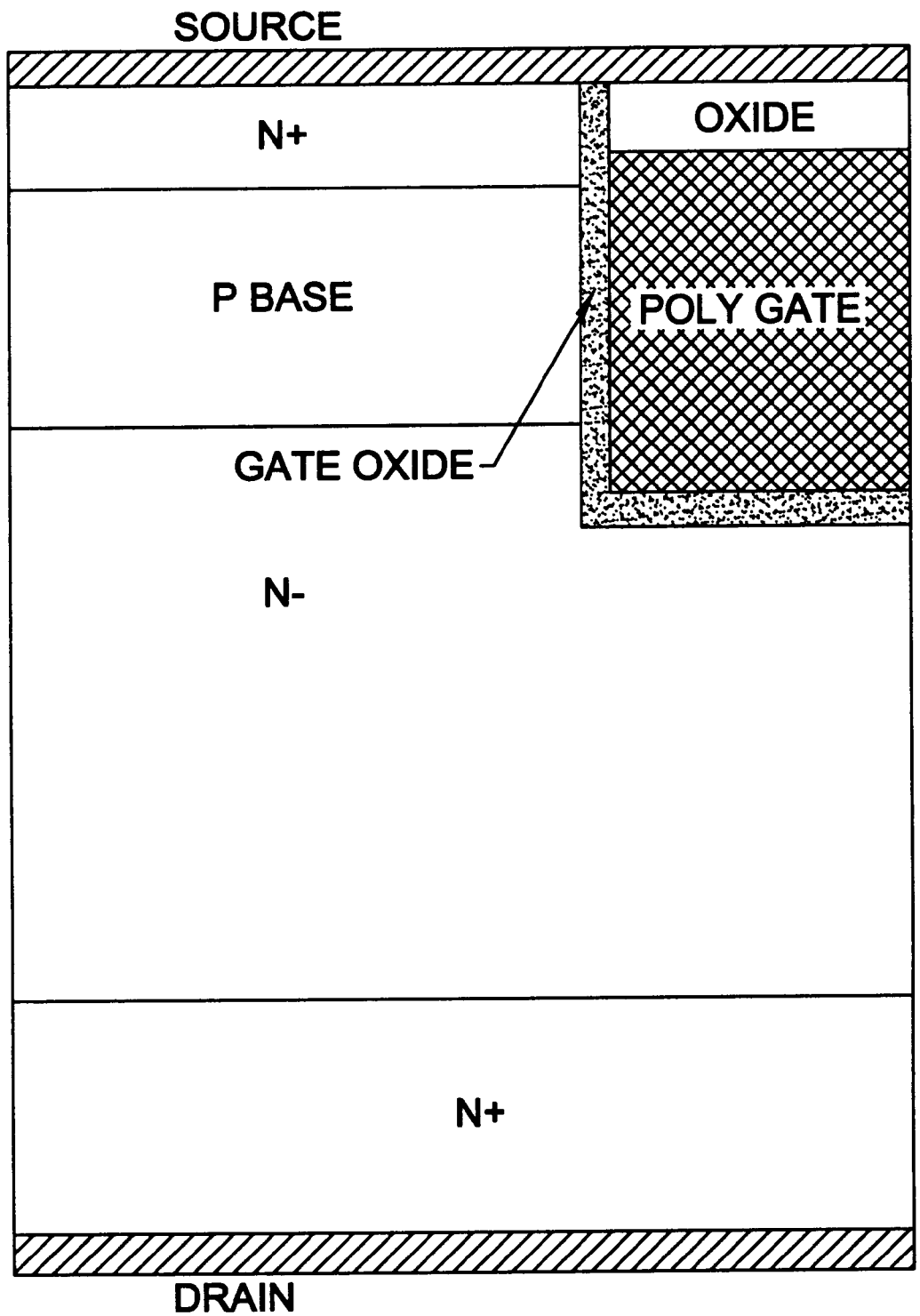
FIG. 1 is a cross-sectional view of a prior art power device.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 3:
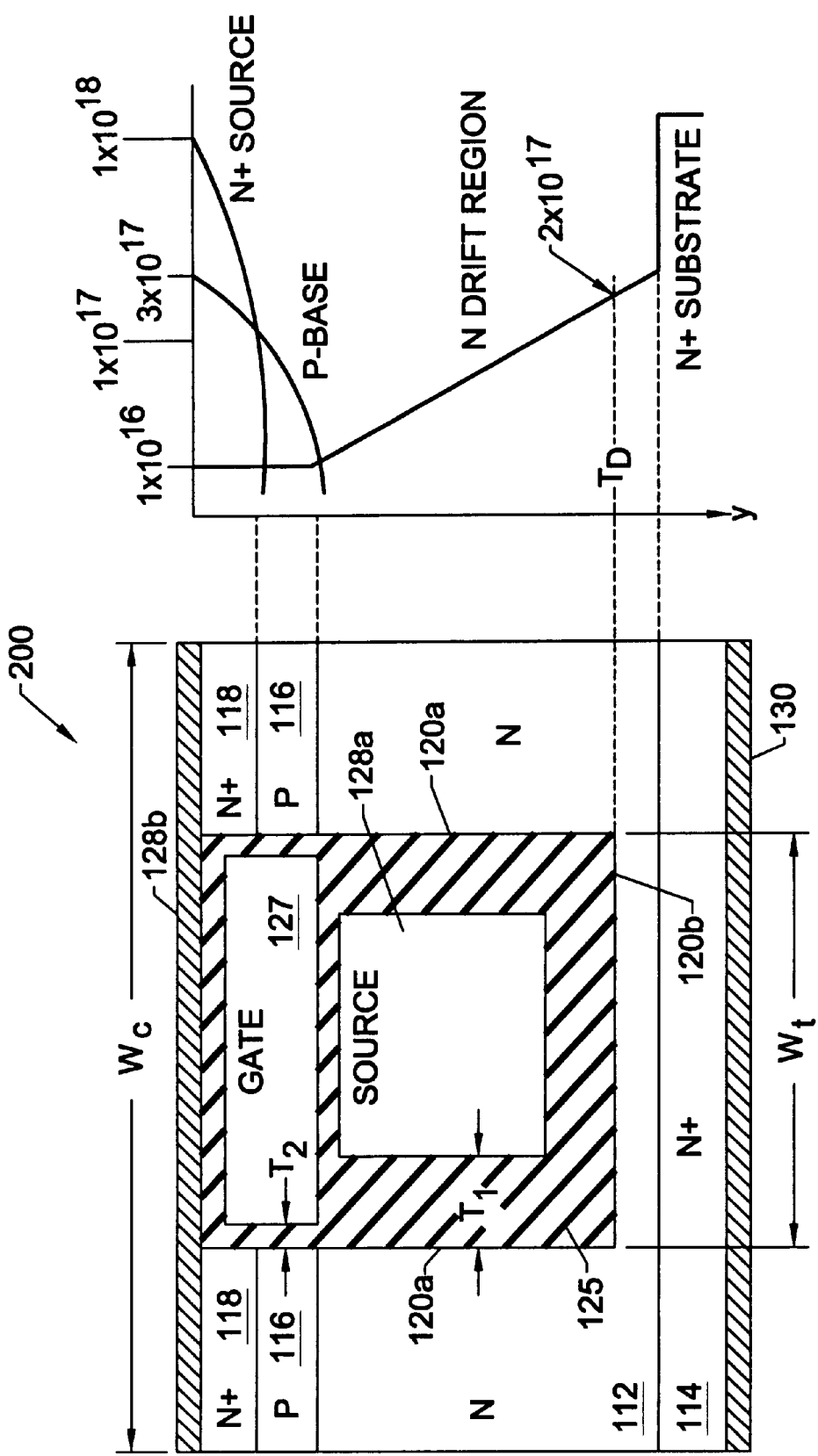
FIG. 3 is a cross-sectional view of a unit cell of an integrated power semiconductor device and doping profile therein, according to a first embodiment of the present invention.

Referring now to FIG. 3, an integrated power semiconductor device according to a first embodiment of the present invention will be described. In particular, a unit cell 200 of a preferred integrated power semiconductor device has a predetermined width "$W_c$" (e.g., 1 μm) and comprises a highly doped drain layer 114 of first conductivity type (e.g., N+), a drift layer 112 of first conductivity type having a linearly graded doping concentration therein, a relatively thin base layer 116 of second conductivity type (e.g., P-type) and a highly doped source layer 118 of first conductivity type (e.g., N+). A source electrode 128*b* and drain electrode 130 may also be provided at the first and second faces, in ohmic contact with the source layer 118 and drain layer 114, respectively. The source electrode 128*b* also preferably forms an ohmic contact with the base layer 116 in a third dimension (not shown). The drift layer 112 may be formed by epitaxially growing an N-type in-situ doped monocrystalline silicon layer having a thickness of about 4 μm on an N-type drain layer 114 (e.g., N+ substrate) having a thickness of 100 μm and a first conductivity type doping concentration of greater than about $1 \times 10^{18}$ cm$^{-3}$ (e.g. $1 \times 10^{19}$ cm$^{-3}$) therein. As illustrated, the drift layer 112 may have a linearly graded doping concentration therein with a maximum concentration of greater than about $5 \times 10^{16}$ cm$^{-3}$ (e.g., $3 \times 10^{17}$ cm$^{-3}$ at the N+/N non-rectifying junction with the drain layer 114 and a minimum concentration of $1 \times 10^{16}$ cm$^{-3}$ at a depth of 1 μm and continuing at a uniform level to the upper face. The base layer 116 may be formed by implanting P-type dopants such as boron into the drift layer 112 at an energy of 100 kEV and at a dose level of $1\times10^{14}$ $cm^{-2}$, for example. The P-type dopants may then be diffused to a depth of 0.5 μm into the drift layer 112. An N-type dopant such as arsenic may then be implanted at an energy of 50 kEV and at dose level of $1\times10^{15}$ $cm^{-2}$. The N-type and P-type dopants are then diffused simultaneously to a depth of 0.5 μm and 1.0 μm, respectively, to form a composite semiconductor substrate containing the drain, drift, base and source layers. As illustrated by FIG. 3, the first conductivity type (e.g., N-type) doping concentration in the drift layer 112 is preferably less than about $5\times10^{16}$ $cm^{-3}$ at the P-N junction with the base layer 116 (i.e., second P-N junction), and more preferably only about $1\times10^{16}$ $cm^{-3}$ at the P-N junction with the base layer 116. The second conductivity type (e.g., P-type) doping concentration in the base layer 116 is also preferably greater than about $5\times10^{16}$ $cm^{-3}$ at the P-N junction with the source layer 118 (i.e., first P-N junction). Furthermore, according to a preferred aspect of the present invention, the second conductivity type doping concentration in the base layer 116 at the first P-N junction (e.g., $1\times10^{17}$ $cm^{-3}$) is about ten times greater than the first conductivity type doping concentration in the drift region at the second P-N junction (e.g., $1\times10^{16}$ $cm^{-3}$).

Figure 2:
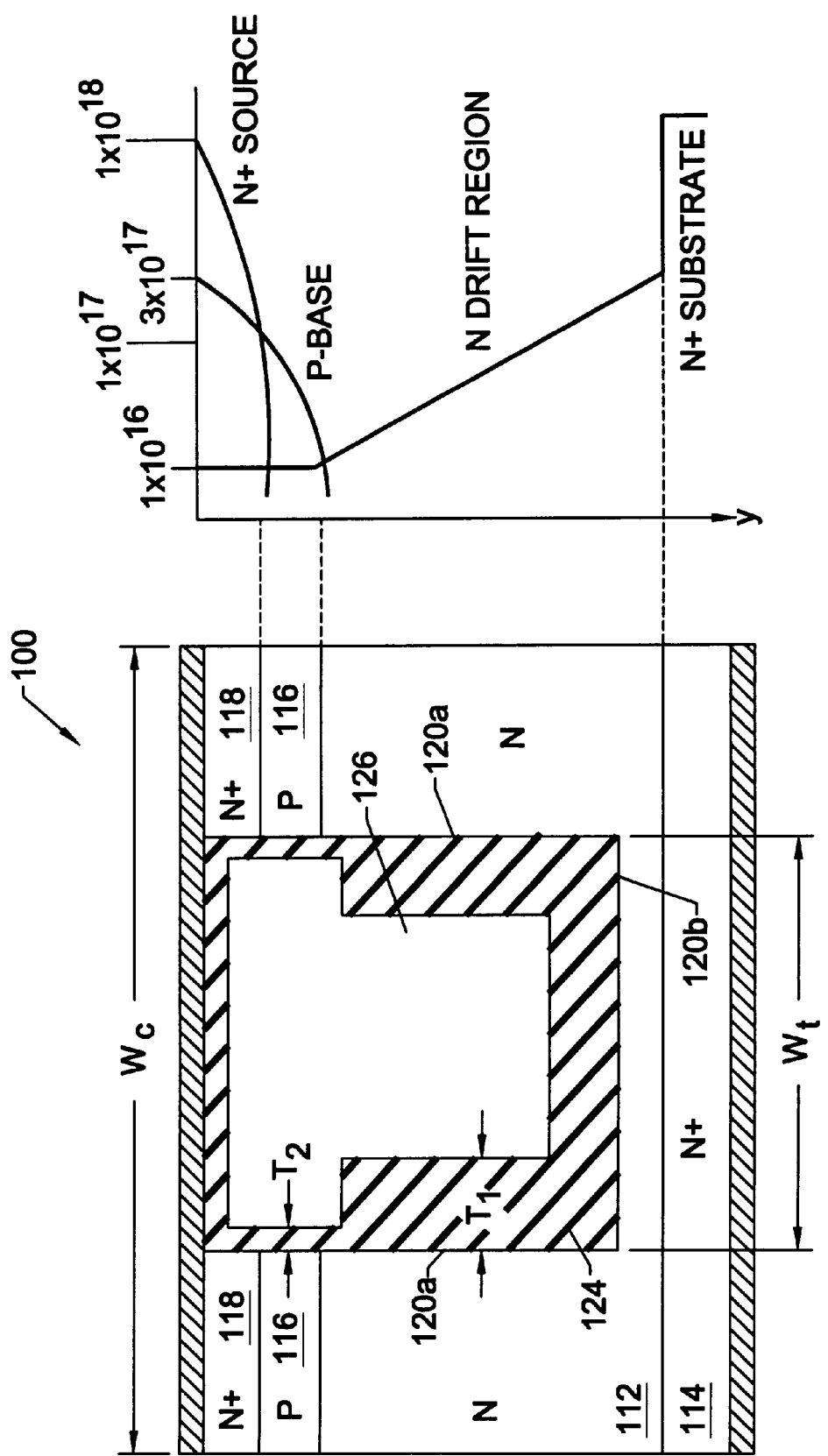
FIG. 2 is a cross-sectional view of another prior art power semiconductor device and doping profile therein.

A stripe-shaped trench having a pair of opposing sidewalls 120a which extend in a third dimension (not shown) and a bottom 120b is then formed in the substrate. For a unit cell 100 having a width $W_c$ of 1 μm, the trench is preferably formed to have a width "$W_t$" of 0.5 μm at the end of processing. A gate electrode/source electrode insulating region 125, a gate electrode 127 (e.g., polysilicon) and a trench-based source electrode 128a (e.g., polysilicon) are also formed in the trench. Because the gate electrode 127 is made relatively small and does not occupy the entire trench, the amount of gate charge required to drive the unit cell 200 during switching is much smaller than the amount of gate charge required to drive the unit cell 100 of FIG. 2 (assuming all other parameters and dimensions are equal), as described more fully hereinbelow.

Here, the trench-based source electrode 128a is electrically connected to the source electrode 128b in a third dimension (not shown). The portion of the gate electrode/source electrode insulating region 125 extending adjacent the trench bottom 120b and the drift layer 112 may also have a thickness "$T_1$" in a range between about 1500 Å and 3000 Å, for example, to inhibit the occurrence of high electric field crowding at the bottom corners of the trench and to provide a substantially uniform potential gradient along the trench sidewalls 120a. However, the portion of the gate electrode/source electrode insulating region 125 extending opposite the base layer 116 and the source layer 118 preferably has a thickness "$T_2$" of of less than about 750 Å, and more preferably about 500 Å to maintain the threshold voltage of the device at about 2–3 volts.

Numerical simulations of the unit cell 200 of FIG. 3 were performed using a drift region doping concentration which increased from a value of $1\times10^{16}$ $cm^{-3}$ at a depth of 1 micron to a value of $2\times10^{17}$ $cm^{-3}$ at a trench depth ($T_D$) of 5 microns. The thin portion of the gate/source electrode insulating region 125 extended to 1.2 microns of a total trench depth of 4.7 microns and had a thickness of 500 Å. The thick portion of the gate/source electrode insulating region 125 had a thickness of 3000 Å. The N+ source layer 118 depth was set to 0.3 microns, and the depth of the P-type base region 116 was set to 0.9 microns. A half-cell width of 1 micron was used based on 1 micron design rules. The polysilicon gate electrode 127 extended to 1.2 microns and the polysilicon source electrode 128a extended from 1.5 microns to 4.4 microns. Based on these parameters, the specific on-resistance ($R_{on,sp}$) at a gate bias of 15 volts was found to be 114 microOhm $cm^2$ and the device blocked more than 60 volts. Comparisons of the potential distributions and contours in the device of FIG. 3 at a drain bias of 60 volts, against the device of FIG. 2, indicated essentially no change in the electric field profile within the drift region. This finding suggests that the trench-based source electrode 128a does not upset the degree of charge coupling and field distribution required to obtain high performance operation. Moreover, even though the specific on-resistance of the device of FIG. 3 was about 20% greater than the specific on-resistance of the device of FIG. 2, the high frequency figure-of-merit (HFOM), defined as $(R_{on,sp}(Q_{GS}+Q_{GD}))^{-1}$, where $Q_{GS}$ and $Q_{GD}$ represent the gate-source and gate-drain charge per unit area, was also calculated to be three (3) times better than the HFOM for the device of FIG. 2. This result means the device of FIG. 3 is very suitable for high frequency operation.

Referring now to FIGS. 4A–4K, a preferred method of forming the integrated power semiconductor device of FIG. 3 will be described. As illustrated best by FIG. 4A, the method begins with the step of forming a semiconductor substrate 10 by epitaxially growing a drift region 12 of first conductivity type (e.g., N-type) on a highly doped drain region 14 of first conductivity type which has a doping concentration greater than $1\times10^{18}$ $cm^{-3}$ therein. Computer controlled in-situ doping of the drift region 12 is also preferably performed during the epitaxial growth step so that the drift region 12 has a linearly graded (or step graded) first conductivity type doping concentration therein which decreases in a direction away from the drain region 14. In particular, the drift region 12 is preferably doped so that the doping concentration of the drift region 12 at the abrupt non-rectifying junction (J3) is greater than about $1\times10^{17}$ $cm^{-3}$ and more preferably about $3\times10^{17}$ $cm^{-3}$, but less than $5\times10^{16}$ $cm^{-3}$ at the first face 15a and more preferably only about $1\times10^{16}$ $cm^{-3}$ at the first face 15a.

Figure 4A:
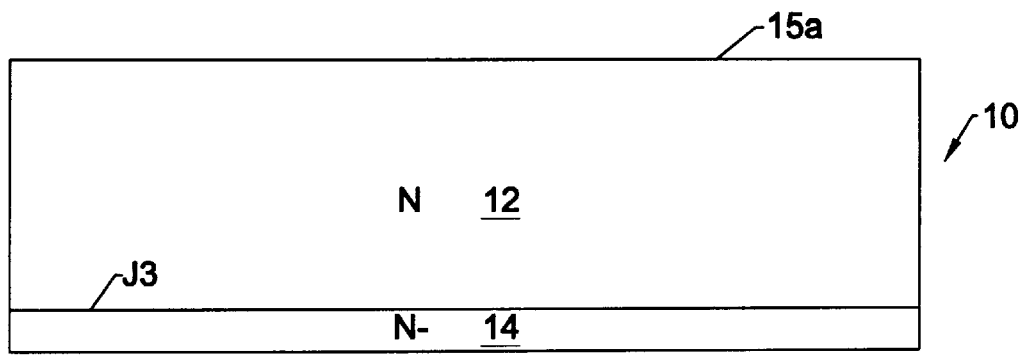
FIGS. 4A–4K are cross-sectional views of intermediate structures which illustrate preferred methods of forming the integrated power semiconductor device of FIG. 3.
Figure 4B:
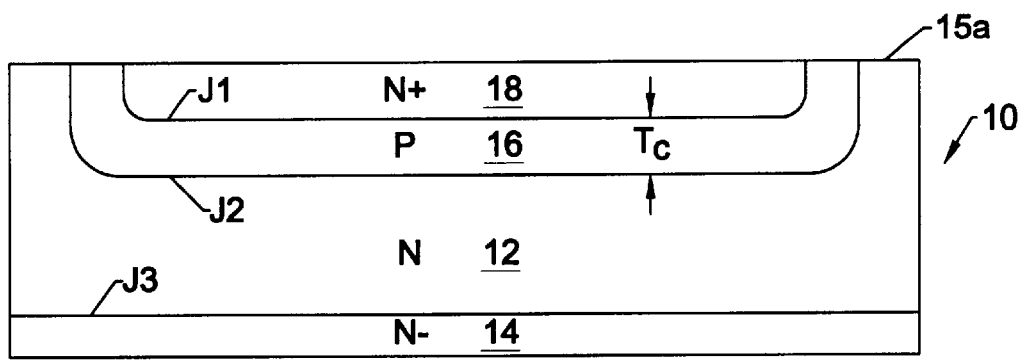

Referring now to FIG. 4B, a thin base region 16 is then formed in the substrate 10 by patterning a first implant mask (not shown) on the first face 15a and then performing an implant of second conductivity type dopants through the first mask. The implanted second conductivity type dopants can then be diffused into the drift region 12 to an initial depth of about 0.5 μm, for example. These steps are then preferably followed by the steps of patterning a second implant mask (not shown) on the first face 15a and performing an implant of first conductivity type dopants through the second mask. The second mask is also preferably patterned in a third dimension (not shown) so that portions of the underlying base region 16 do not receive the implanted source dopants. These portions of the base region 16 which extend to the first face 15a can be ohmically contacted by a source electrode at the end of processing. The implanted first conductivity type dopants and the second conductivity type dopants can then be diffused to a depth of about 0.5 μm and 1.0 μm, respectively, to provide a base region thickness "$T_c$" of about 0.5 μm. Preferably, boron (B) is used as a P-type dopant and is implanted at a dose level of about $1\times10^{14}$ $cm^{-2}$ and at an energy of 100 keV. Arsenic (As) is preferably used as an N-type dopant and is implanted at a dose level of about $10\times15$ $cm^{-2}$ and at an energy of 50 KeV.

As will be understood by those skilled in the art, the implant and diffusion steps will cause the doping profile of the second conductivity type dopants in the substrate 10 to be generally gaussian in shape and have a maximum value at the first face 15a. The doping concentration in the base region 16 will also have a maximum value adjacent the source region 18 and a minimum value adjacent the drift region 12. In particular, the implant and diffusion steps may be performed so that the first conductivity type dopant concentration of the source region 18 at the first face 15a is greater than $1\times10^{18}$ cm$^{-3}$ and the second conductivity type dopant concentration in the base region 16 is greater than about $1\times10^{17}$ cm$^{-3}$ at a first P-N junction (J1) with the source region 18, but less than about $5\times10^{16}$ cm$^{-3}$ and more preferably only about $1\times10^{16}$ cm$^{-3}$ at the second P-N junction (J2) with the drift region 12. To meet these criteria, the first conductivity type doping concentration in the drift region 12 should be about $1\times10^{16}$ cm$^{-3}$ at the second P-N junction (J2). Because of this relatively low value of $1\times10^{16}$ cm$^{-3}$ in the drift region 12, the base region 16 can be made thin (e.g., 0.5 μm) without being susceptible to parasitic reach-through breakdown and can be doped relatively low to maintain the transistor's threshold voltage at about 2–3 volts.

Figure 4C:
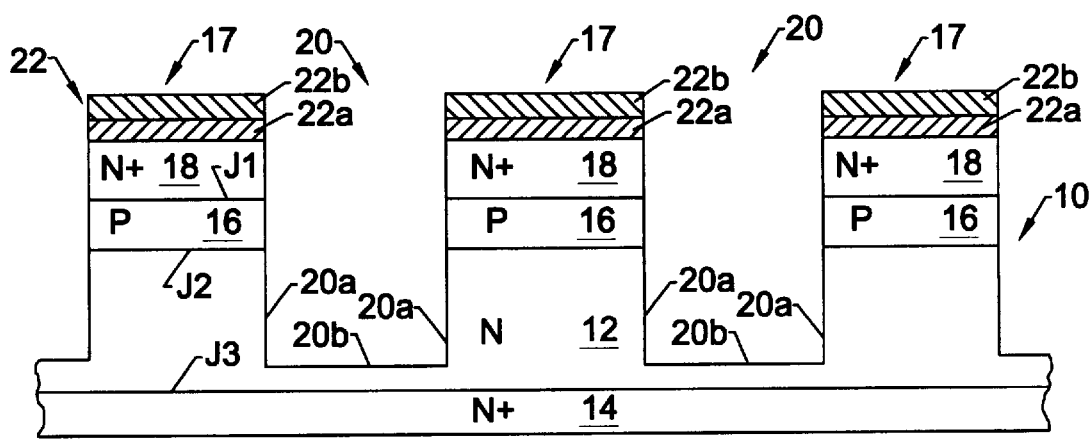

Referring now to FIG. 4C, an etching mask 22 including a stress relief oxide layer 22a and an oxidation barrier layer 22b (e.g., Si$_3$N$_4$) is then patterned on the first face 15a to define openings which expose adjacent portions of the first face extending over the source and base regions 18 and 16. The source, base and drift regions are then chemically etched to form a plurality of trenches 20. As illustrated, each of the trenches has opposing vertical sidewalls 20a which define interfaces between the source, base and drift regions and an interior of the trench, and a trench bottom 20b in the drift region. Facing sidewalls 20a of adjacent trenches also define respective mesas 17 which may have uniform widths of about 0.5 μm at the end of processing. The trenches 20 and mesas 17, which extend in a third dimension, not shown, can be of stripe or similar geometry. The mesas 17 can also be polygonal (e.g., hexagonal) in shaped with the trenches 20 defining a continuous mesh when viewed from a direction normal to the face 15a. As explained more fully hereinbelow, the widths of the mesas 17 can be selected to improve the blocking voltage capability of the transistor. In particular, the width of the mesas 17 (at the end of processing) and the doping concentration in the drift region 12 at J3 should be selected so that their product is within the range of $1\times10^{13}$–$2\times10^{13}$ cm$^{-2}$ to obtain a preferred charge concentration in the drift region 12. In addition, the width of the mesas 17 and the doping concentration in the drift region 12 at J2 should be selected so that their product is within the range of $1\times10^{11}$–$2\times10^{12}$ cm$^{-2}$.

Figure 4D:
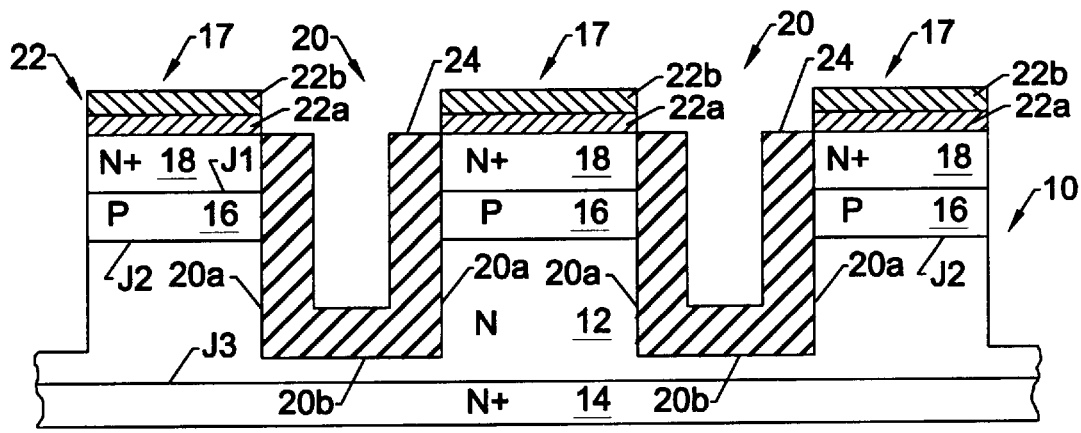
Figure 4E:
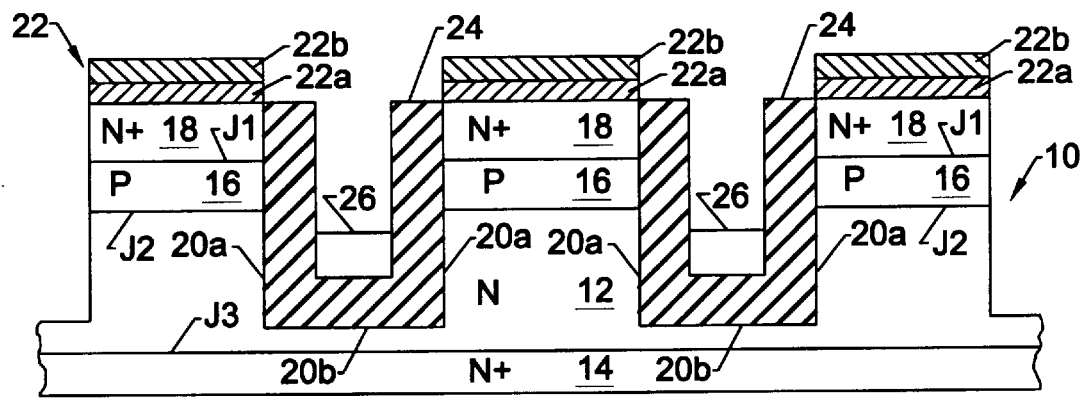
Figure 4F:
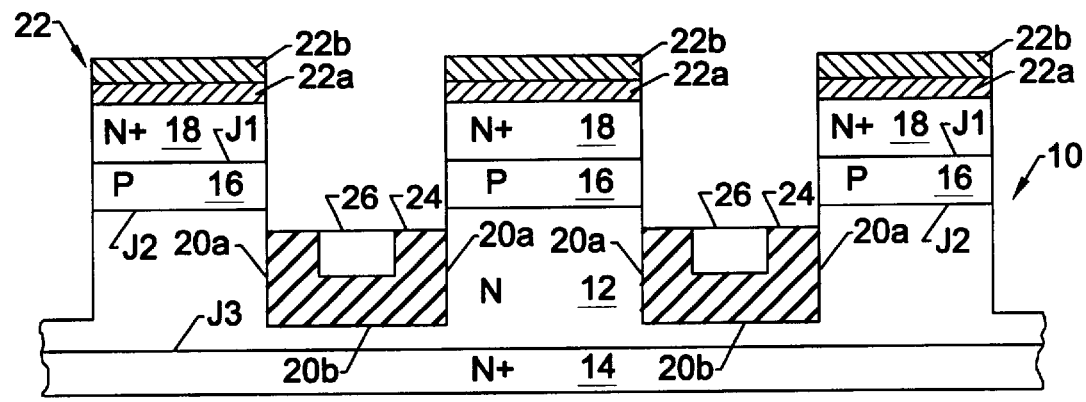

Referring now to FIG. 4D which illustrates a cross-section of three adjacent mesas 17, the method continues with the formation of a first electrically insulating region 24 (e.g., SiO$_2$) having a first thickness greater than 1000 Å and more preferably about 3000 Å, on the trench sidewalls 20a and the trench bottom 20b of each trench 20. This step is preferably performed by oxidizing the etched source, base and drift regions, using the oxidation barrier layer 22b as an oxidation mask. As will be understood by those skilled in the art, the growth of an oxide having a thickness of about 3000 Å will typically consume about 0.1 μm or more of semiconductor material. Accordingly, the initial widths of the mesas 17 should be selected so that at the end of processing the widths are at the desired value of about 0.5 μm.

Figure 4G:
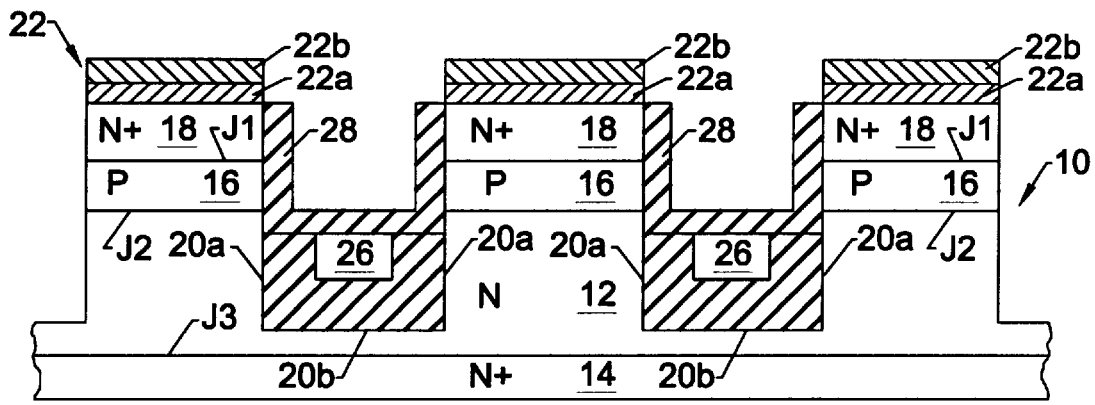
Figure 4H:
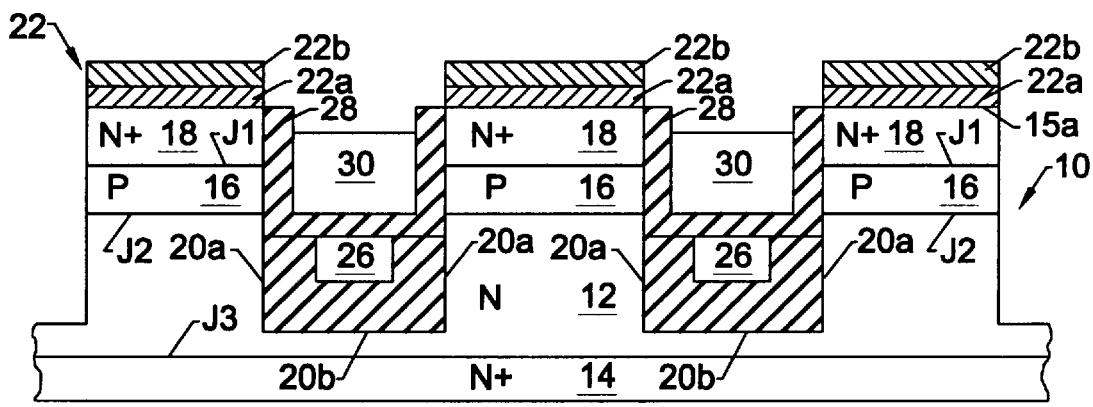
Figure 4I:
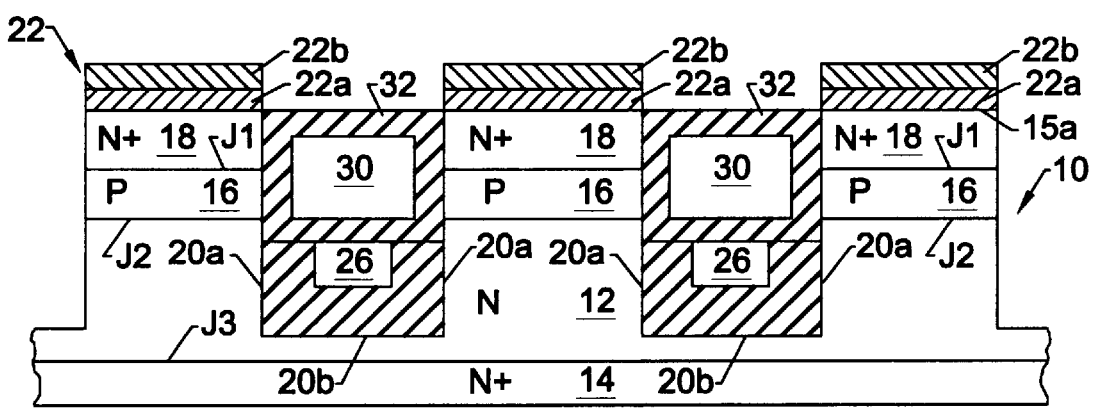

Referring now to FIGS. 4E–4K, a conformal N-type first polycrystalline silicon region 26 is then deposited and etched until it is recessed in the trench to a depth just below the second P-N junction (J2). This first polysilicon region 26 defines a trench-based source electrode. An oxide etching step is then performed to remove the first electrically insulating region 24 from the portions of the sidewalls 20a which extend adjacent the etched source and base regions 18 and 16, as illustrated best by FIG. 2F. Referring now to FIG. 4G, a second electrically insulating region 28 (e.g., SiO$_2$) having a second thickness less than about 1000 Å and more preferably about 500 Å, is then formed on the exposed trench sidewalls 20a and on the polysilicon region 26. Referring now to FIG. 2H, a conformal second polycrystalline silicon region 30 is then deposited on the second electrically insulating region 28. The second polycrystalline silicon region 30 is then etched until it is recessed in the trench to a depth just below the first face 15a. Steps are also preferably performed to expose the first polysilicon region 26 in a third dimension (not shown) so that subsequent contact can be made to a source electrode on the face 15a.

Figure 4J:
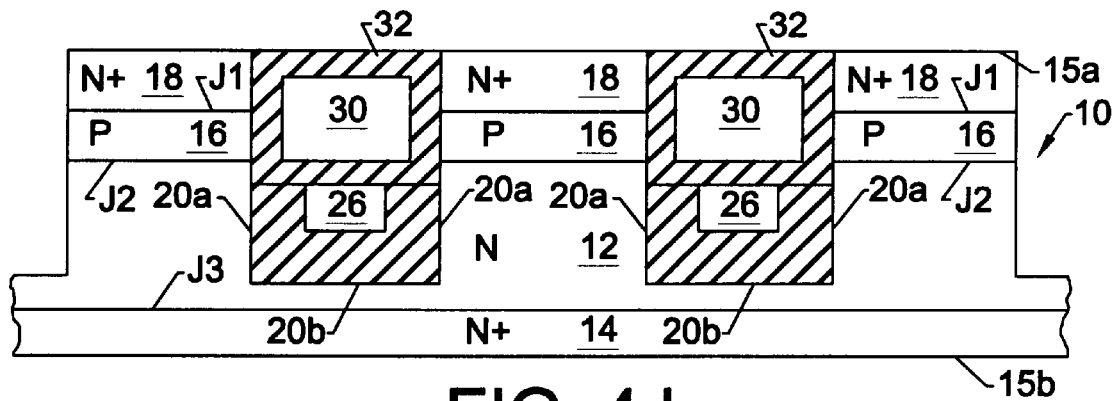
Figure 4K:
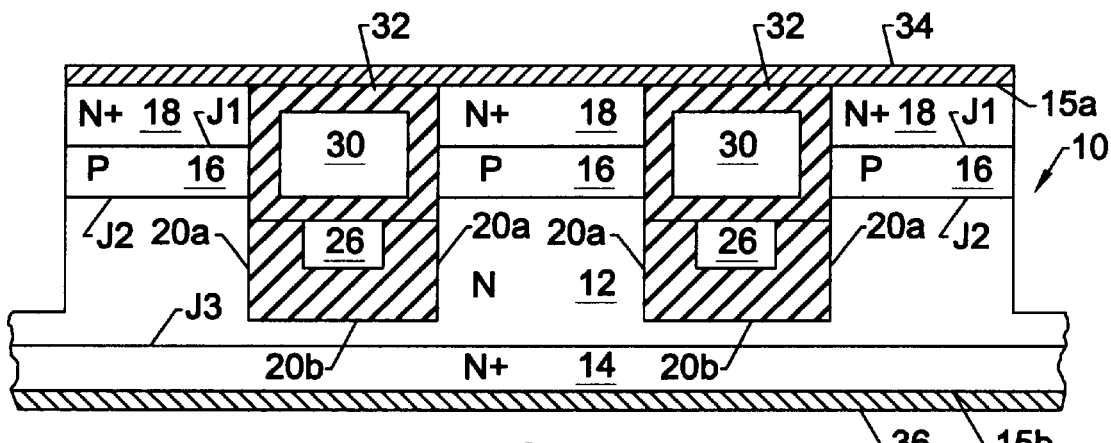

A third electrically insulating region 32 is then formed on the etched second polycrystalline silicon region 30 by oxidizing the second polycrystalline silicon region 30, as illustrated by FIG. 2I. The stress relief oxide layer 22a and the oxidation barrier layer 22b (e.g., Si$_3$N$_4$) are then etched to expose the source region 18 and base region 16 at the first face 15a, as illustrated by FIG. 4J. A source metal contact layer 34 is then deposited on the first face 15a and a drain metal contact layer 36 is deposited on an opposing second face 15b to form ohmic contacts to the source, base and first polysilicon regions (18, 16 and 26) and drain region 14, respectively, as illustrated by FIG. 4K.

Figure 5:
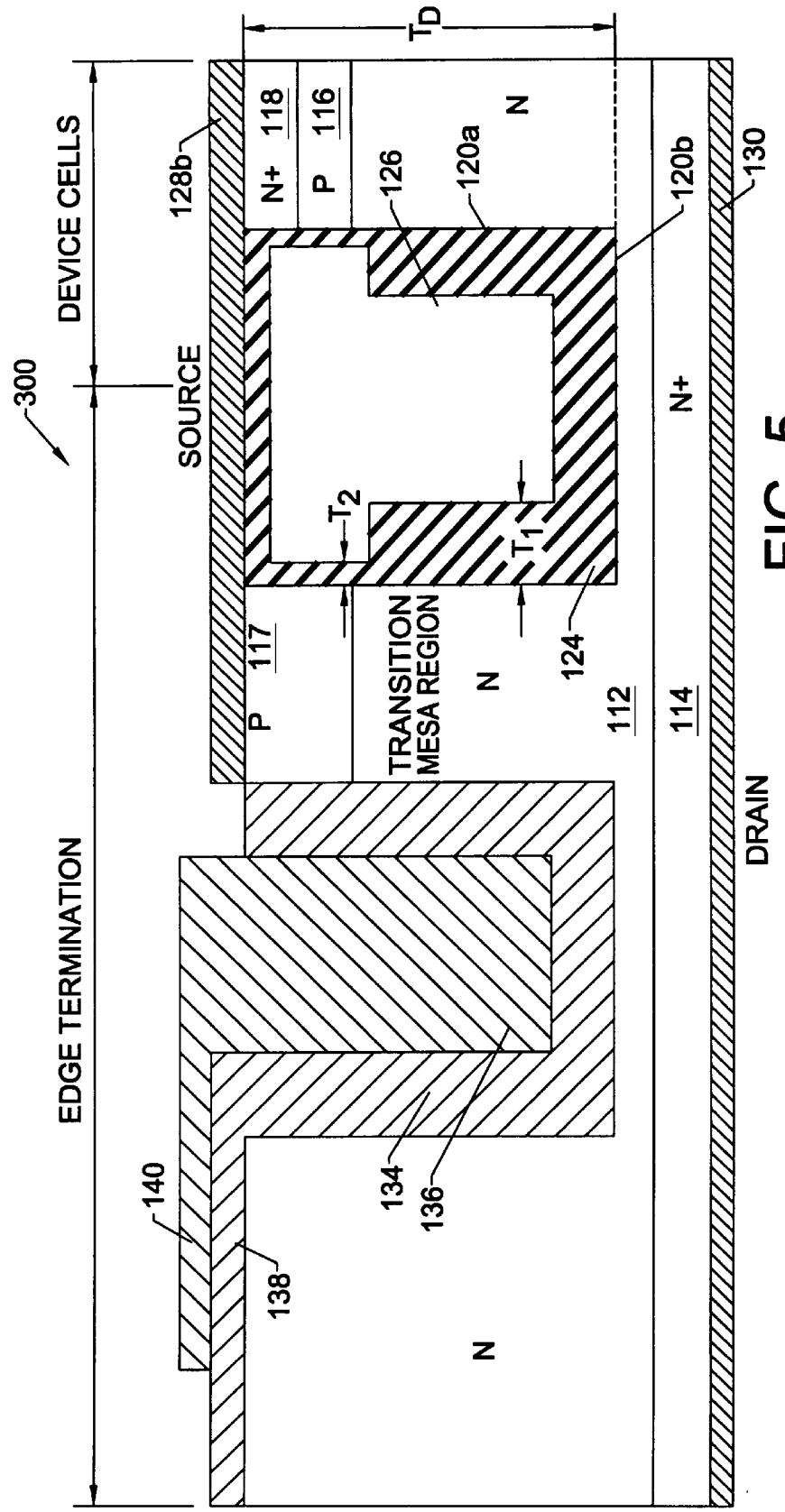
FIG. 5 is a cross-sectional view of an integrated power semiconductor device according to a second embodiment of the present invention.

Referring now to FIG. 5, an integrated power semiconductor device 300 according to a second embodiment of the present invention will be described. As illustrated, this power device 300 includes an active device region and an edge termination region which may extend adjacent an outermost edge of a semiconductor substrate containing the power device 300. According to one aspect of this embodiment, the active device region may include a plurality of unit cells which are similar to the unit cells 100 and 200 of FIGS. 2 and 3, respectively. However, to improve edge termination characteristics, an edge termination trench is provided in the edge termination region and a uniformly thick first field plate insulating region 134 is provided which lines the sidewalls and bottom of the edge termination trench. A field plate 136, comprising a material such as N-type polysilicon, is also provided on the first field plate insulating region 134. In addition, a second field plate insulating region 138 is provided on the first face and this second field plate insulating region overlaps the first field plate insulating region 134. To complete the field plate structure, a field plate extension 140 is provided. This field plate extension 140, which is electrically connected to the field plate 136, is provided on the second field plate insulating region 138 and extends opposite the face of the substrate, as illustrated. This field plate extension 140 may also comprise N-type polysilicon. The field plate 136 is also preferably connected to the source electrode 128b or gate electrode 126.

Figure 6:
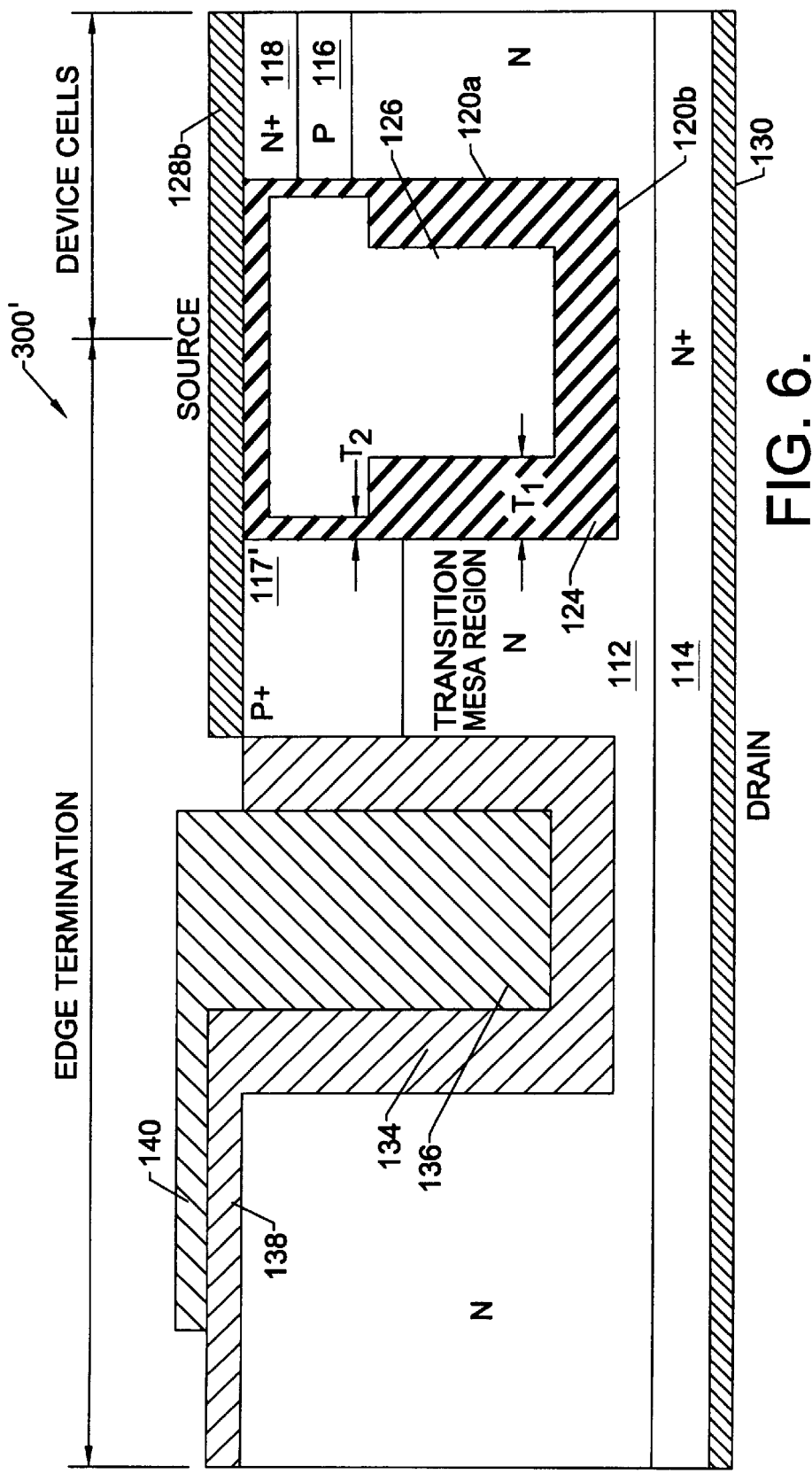
FIG. 6 is a cross-sectional view of an integrated power semiconductor device according to a third embodiment of the present invention.

To improve the edge termination and breakdown characteristics of the integrated power device 300 even further, the edge termination trench is preferably positioned so that a transition mesa region is defined between opposing sidewalls of the edge termination trench and the trench corresponding to the outermost unit cell of the device 300. However, unlike the mesa regions which are defined between trenches within the active device region of the integrated power device 300, the transition mesa region is preferably formed to be devoid of a source region of first conductivity type. Instead, a preferred breakdown shielding region 117 of second conductivity type (e.g., P-type) is provided. The breakdown shielding region 117 may be formed at the same time the base region 116 is formed, for example. However, as illustrated best by FIG. 6 which is a cross-sectional view of an integrated power semiconductor device 300' according to a third embodiment of the present invention, the breakdown shielding region 117' may also be formed deeper (and more highly doped) than the base region 116 to further increase the likelihood that avalanche breakdown will occur in the transition mesa region instead of within the active region. The use of breakdown shielding regions to improve the breakdown characteristics of power semiconductor devices is also described in commonly assigned U.S. application Ser. No. 09/167,298, filed Oct. 6, 1998, entitled "Rugged Schottky Barrier Rectifiers Having Improved Avalanche Breakdown Characteristics", the disclosure of which is hereby incorporated herein by reference.

Numerical simulations of the unit cell 300 of FIG. 5 were performed using a drift region doping concentration which increased from a value of $1 \times 10^{16}$ cm$^{-3}$ at a depth of 1 micron to a value of $2 \times 10^{17}$ cm$^{-3}$ at a trench depth ($T_D$) of 5 microns. The thin portion of the gate electrode insulating region 124 had a thickness of 500 Å, the thick portion of the gate electrode insulating region 124 had a thickness of 3000 Å and the first field plate insulating region 134 had a uniform thickness of 3000 Å. Based on these parameters, the simulated potential contours were shown to be uniformly spaced in both the active and termination regions. The simulated current flowlines also indicated that breakdown would occur simultaneously in both the active and termination regions so long as the breakdown shielding region 117 is electrically connected to the source electrode 128b. Accordingly, breakdown in the integrated power device 300 of FIG. 5 is not expected to be edge limited. Moreover, in applications where the GD-MOSFET unit cells in the active region are expected to be frequently driven into avalanche breakdown, it is preferable to move the location of avalanche breakdown to the more highly doped and deeper breakdown shielding region 117' within the device 300' of FIG. 6. In particular, by increasing the depth of the breakdown shielding region 117', the breakdown voltage can be decreased to a level which will provide sufficient protection to the unit cells in the active device area and improve the lifetime and reliability of the overall device 300'. In addition, as described more fully hereinbelow with respect to FIG. 7, the breakdown voltage and the specific on-resistance $R_{sp,on}$ can also be scaled downward by decreasing the epitaxial layer thickness of the drift region 112.

Figure 7:
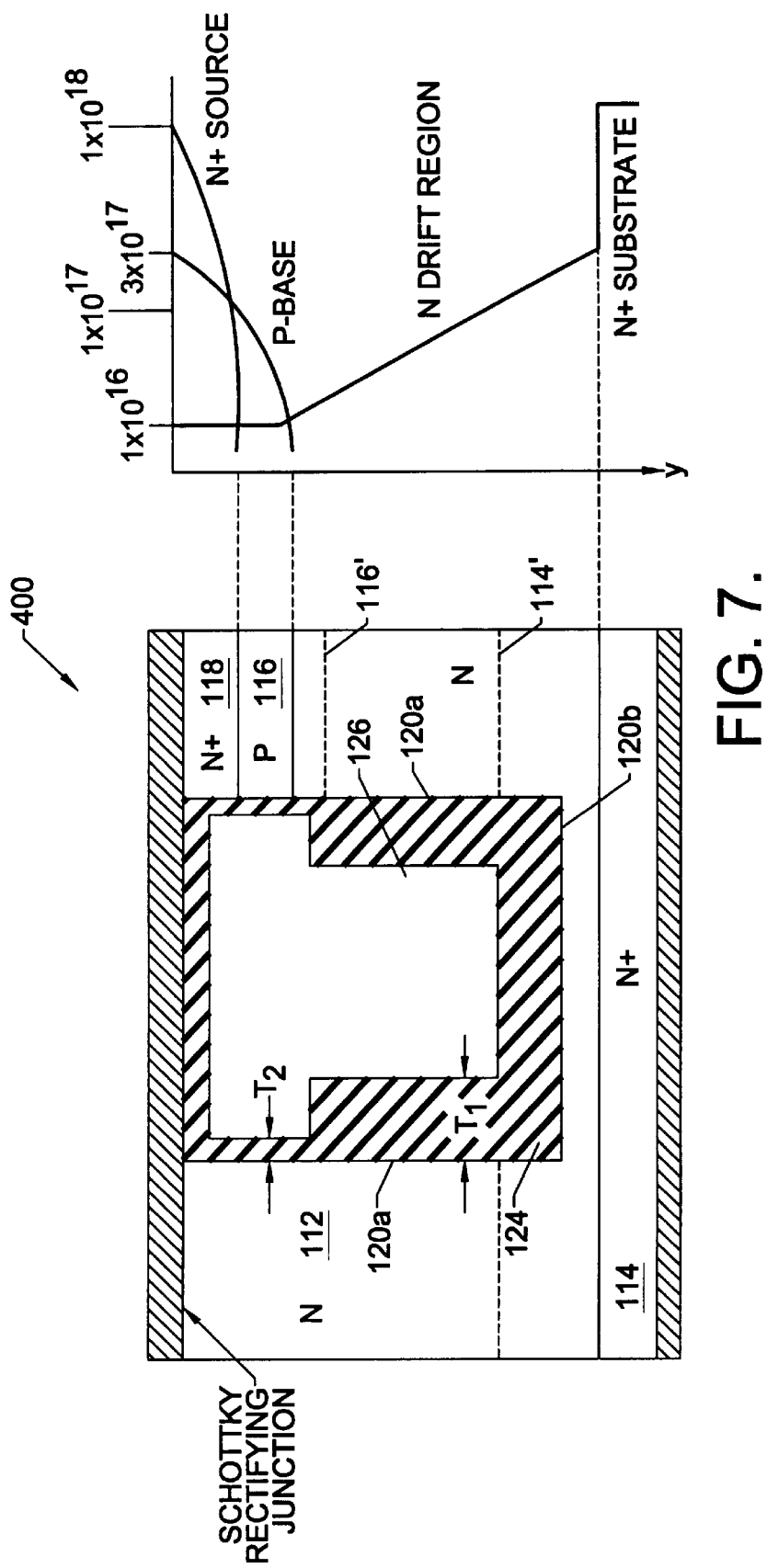
FIG. 7 is a cross-sectional view of an integrated power semiconductor device according to a fourth embodiment of the present invention.

Referring now to FIG. 7, an integrated power semiconductor device 400 according to a fourth embodiment of the present invention will be described. As illustrated, this power device 400 is a hybrid device which may contain the GD-UMOSFET unit cells of FIGS. 2 and 3 (having non-uniformly thick gate insulating regions therein) extending adjacent one sidewall of each trench in the active region and a modified TMBS Schottky rectifier (acting as a flyback diode) extending adjacent an opposing sidewall of each trench. In the modified TMBS Schottky rectifier illustrated on the left side of the unit cell of FIG. 7, preferred charge coupling is provided by a gate electrode within a trench having a non-uniformly thick gate insulating region therein, instead of an anode electrode and a uniformly thick insulating region. Moreover, whereas conventional TMBS rectifiers, such as those disclosed in U.S. Pat. No. 5,612,567 to Baliga which is hereby incorporated herein by reference, include a linearly graded drift region doping concentration which extends all the way to the Schottky rectifying junction at the face, a uniformly doped region extends adjacent the Schottky rectifying junction in the modified TMBS rectifier of FIG. 7. As illustrated, this uniformly doped portion of the drift region has a doping concentration of $1 \times 10^{16}$ cm$^{-3}$ therein. The advantages of including a uniformly doped region adjacent the Schottky rectifying junction in a TMBS device are more fully described in the aforementioned application entitled "Rugged Schottky Barrier Rectifiers Having Improved Avalanche Breakdown Characteristics".

This hybrid power device 400 is designed so that the GD-MOSFET unit cells have very low specific on-state resistance, the modified TMBS structure has very low leakage current and low on-state voltage drop and the combined hybrid structure exhibits very low parasitic inductance. In particular, simulations of the hybrid device of FIG. 7 illustrate that the on-state voltage drop of both the GD-MOSFET and modified TMBS are reduced because of improved current spreading in the N+ substrate region 114. The specific on-resistance $R_{sp,on}$ can also be scaled downward by decreasing the epitaxial layer thickness of the drift region 112. This reduction in epitaxial layer thickness causes the non-rectifying junction formed between the drift region 112 and the drain region 114' (illustrated by the dotted line in FIG. 7) to move up along the sidewalls of each trench, without any other modification in the process. Accordingly, the reduction in epitaxial layer thickness (or increase in trench depth) results in the formation of an interface between the bottom of the trench 120b and the drain region 114'. The simulations also indicate the possibility of higher temperature operation with smaller heat sinks because of an improvement in the leakage current characteristics. The hybrid device also limits the amount of parasitic inductance between the GD-MOSFET and modified TMBS rectifiers within each unit cell.

As further illustrated by FIG. 7, an increase in the depth of the base region 116 to the level illustrated by the dotted line 116' can also be used advantageously to suppress the degree of any impact ionization near the gate insulating region 124 which may arise in response to hot electron injection during avalanche breakdown. In particular, steps to form the gate insulating region so that there is an overlap between the thick portion of the gate insulating region 124 (extending upward from the bottom of the trench) and the base region 116 can be used to enhance the electric field contours at the corner of the gate between the thick and thin portions and thereby shield the gate insulating region from the effects of hot electron induced instabilities during avalanche breakdown. Accordingly, the gate insulating region 124 may have a first thickness (shown as $T_2$) of less than about 750 Å as measured between the gate electrode 126 and a first intersection between the first sidewall and the P-N junction formed between the source region 118 and P-base region 116. In addition, the gate insulating region 124 may have a second thickness (shown as $T_1$) of greater than about 1500 Å as measured between the gate electrode 126 and a second intersection between the first sidewall and the P-N junction formed between the P-base region 116 and the drift region 112. Moreover, because of the illustrated graded doping profile of the base region 116 which falls off near the base/drift region junction, it is still possible to form an inversion layer channel across the entire base region 116 even though the gate oxide thickness is relatively large (e.g., 3000 Å) at the drain side of the base region 116. Designing the unit cell to provide this gate shielding advantage may, however, result in some increase in the specific on-state resistance of the device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A UMOSFET, comprising:

a semiconductor substrate;

a first trench in said substrate;

an insulated gate electrode in said first trench; and a source electrode in said first trench, extending between said insulated gate electrode and a bottom of said first trench.

2. The UMOSFET of claim 1, wherein said substrate contains a graded-doped drift region therein.

3. The UMOSFET of claim 1, further comprising:

a second trench in said substrate, adjacent said first trench;

a first field plate insulating region lining said second trench; and a field plate on said first field plate insulating region.

4. The UMOSFET of claim 3, further comprising:

a second field plate insulating region on a face of said substrate; and a field plate extension on the second field plate insulating region and electrically connected to said field plate.

5. The UMOSFET of claim 4, wherein said field plate extension and said field plate are electrically connected to said gate electrode or said source electrode.

6. The UMOSFET of claim 1, further comprising a Schottky rectifying contact on said substrate, adjacent said first trench.

7. A vertical power device, comprising:

a trench in a semiconductor substrate;

a source region of first conductivity type in the semiconductor substrate;

an insulated first source electrode in and adjacent a bottom of said trench;

a second source electrode on the substrate, electrically coupled to said source region and said insulated first source electrode; and an insulated gate electrode in and adjacent a top of said trench.

8. The device of claim 7, wherein said trench has first and second opposing sidewalls; and wherein said second source electrode forms an ohmic contact with a portion of said source region extending adjacent the first sidewall and forms a Schottky rectifying contact with a portion of the semiconductor substrate extending adjacent the second sidewall.

9. The device of claim 7, further comprising:

a base region of second conductivity type in a portion of the semiconductor substrate extending adjacent a first sidewall of said trench; and a breakdown shielding region of second conductivity type in a portion of the semiconductor substrate extending adjacent a second sidewall of said trench.

10. The device of claim 9, wherein said breakdown shielding region is more highly doped than said base region.

11. The device of claim 10, wherein said breakdown shielding region extends deeper into the semiconductor substrate than said base region.

12. The device of claim 9, wherein said breakdown shielding region extends adjacent the second sidewall of said trench.

13. The device of claim 12, wherein said breakdown shielding region extends deeper into the semiconductor substrate than said base region.

14. A field effect transistor, comprising:

a semiconductor substrate having first and second opposing faces;

a source region of first conductivity type in said substrate, adjacent the first face;

a drain region of first conductivity type in said substrate, adjacent the second face;

a drift region of first conductivity type in said substrate, said drift region forming a non-rectifying junction with said drain region;

a base region of second conductivity type in said substrate, said base region extending between said source region and said drift region and forming first and second P-N junctions therewith, respectively;

a first trench in said substrate at the first face, said first trench having a sidewall extending adjacent said drift region and said base region and a bottom extending adjacent said drain region;

a gate electrode in said first trench, extending opposite said base region;

a first source electrode in said first trench, said first source electrode extending between said gate electrode and the bottom of said first trench; and an electrically insulating region in said first trench, said electrically insulating region extending along the sidewall of said first trench and between said gate electrode and said first source electrode.

15. The transistor of claim 14, wherein said drift region has a graded first conductivity type doping concentration therein which decreases in a direction from said drain region to said base region.

16. The transistor of claim 15, wherein said electrically insulating region includes a gate insulating region having a first thickness as measured between said gate electrode and the sidewall of said first trench, and a source insulating region having a second thickness as measured between said first source electrode and the sidewall of said first trench; and wherein the second thickness is greater than the first thickness.

17. The transistor of claim 16, wherein the first thickness is less than about 750 Å; and wherein the second thickness is greater than about 1500 Å.

18. The transistor of claim 16, further comprising:

a second trench in said substrate at the first face, adjacent said first trench;

a first field plate insulating region having a uniform thickness lining said second trench; and a field plate in said second trench, on said first field plate insulating region.

19. The transistor of claim 18, further comprising:

a second field plate insulating region on the first face; and a field plate extension on the second field plate insulating region, opposite the first face.

20. The transistor of claim 19, wherein said field plate extension and said field plate are electrically connected together and are electrically connected to said gate electrode or said first source electrode.

21. The transistor of claim 18, wherein said first and second trenches define a transition mesa region therebetween; and wherein said transition mesa region comprises a breakdown shielding region of second conductivity type therein which forms a third P-N junction with said drift region.

22. The transistor of claim 21, further comprising a second source electrode on the first face, ohmically contacting said source region; and wherein said first and second source electrodes are electrically connected together and to said break down shielding region.

23. The transistor of claim 22, wherein said transition mesa region is devoid of a source region of first conductivity type therein.

24. The transistor of claim 22, wherein a distance between the first face and the third P-N junction is greater than a distance between the first face and the second P-N junction.

25. The transistor of claim 24, wherein said breakdown shielding region is more highly doped than said base region.

26. The transistor of claim 16, wherein the bottom of said trench defines an interface between said electrically insulating region and said drain region.

27. The transistor of claim 15, further comprising a second source electrode on the first face, ohmically contacting said source region; and wherein said first and second source electrodes are electrically connected together.

28. The transistor of claim 15, wherein the first conductivity type doping concentration in said drift region is less than about $5 \times 10^{16}$ cm$^{-3}$ at the second P-N junction; and wherein the first conductivity type doping concentration in said drift region is greater than about $5 \times 10^{16}$ cm$^{-3}$ at the non-rectifying junction.

29. The transistor of claim 28, wherein the second conductivity type doping concentration in said base region is greater than about $5 \times 10^{16}$ cm$^{-3}$ at the first P-N junction; and wherein the first conductivity type doping concentration in said drift region at the non-rectifying junction is greater than the second conductivity type doping concentration in said base region at the first P-N junction.

30. The transistor of claim 28, wherein the second conductivity type doping concentration in said base region at the first P-N junction is about ten times greater than the first conductivity type doping concentration in said drift region at the second P-N junction.

31. The transistor of claim 14, wherein said electrically insulating region includes a gate insulating region having a first thickness as measured between said gate electrode and the sidewall of said first trench, and a source insulating region having a second thickness as measured between said first source electrode and the sidewall of said first trench; and wherein the second thickness is greater than the first thickness.

32. The transistor of claim 14, further comprising a second source electrode on the first face, ohmically contacting said source region; and wherein said first and second source electrodes are electrically connected together.

33. The transistor of claim 14, further comprising:
a second trench in said substrate at the first face, adjacent said first trench;
a first field plate insulating region lining said second trench; and
a field plate on said first field plate insulating region.

34. The transistor of claim 33, further comprising:
a second field plate insulating region on the first face; and
a field plate extension on the second field plate insulating region, opposite the first face.

35. The transistor of claim 34, wherein said field plate extension and said field plate are electrically connected together and are electrically connected to said gate electrode or said first source electrode.

36. A semiconductor switching device, comprising:
a semiconductor substrate having first and second opposing faces;
a drain region of first conductivity type in said substrate, adjacent the second face;
a drift region of first conductivity type in said substrate, said drift region forming a non-rectifying junction with said drain region;
a trench in said substrate at the first face, said trench having first and second opposing sidewalls which extend into said drift region;
a source region of first conductivity type in said substrate, said source region extending opposite the first sidewall of said trench and adjacent the first face;
a base region of second conductivity type in said substrate, said base region extending between said source region and said drift region and forming first and second P-N junctions therewith, respectively;
a gate electrode insulating region lining the first and second sidewalls of said trench;
a gate electrode in said trench, on said gate electrode insulating region;
a Schottky contact adjacent the first face, said Schottky contact forming a Schottky rectifying junction with a portion of said drift region extending opposite the second sidewall of said trench;
a first source electrode disposed between said gate electrode and a bottom of said trench; and
a second source electrode on the first face, ohmically contacting said source region.

37. The device of claim 36, wherein said drift region has a graded first conductivity type doping concentration therein which decreases in a direction from said drain region to said base region.

38. The device of claim 37, wherein said drift region includes a uniformly doped region of first conductivity type therein extending adjacent the first face; and wherein said Schottky contact forms a Schottky rectifying junction with said uniformly doped region.

39. The device of claim 38, wherein a thickness of said gate electrode insulating region as measured between said gate electrode and said base region is less than about 750 Å; and wherein a thickness of said gate electrode insulating region as measured between said gate electrode and said drift region is greater than about 1500 Å.

40. The device of claim 37, wherein a bottom of said trench defines an interface between said gate electrode insulating region and said drain region.

41. A semiconductor switching device, comprising:
a semiconductor substrate having first and second opposing faces;
a drain region of first conductivity type in said substrate, adjacent the second face;
a drift region of first conductivity type in said substrate, said drift region forming a non-rectifying junction with said drain region;
a trench in said substrate at the first face, said trench having first and second opposing sidewalls which extend into said drift region;
a source region of first conductivity type in said substrate, said source region extending opposite the first sidewall of said trench and adjacent the first face;
a base region of second conductivity type in said substrate, said base region extending between said source region and said drift region and forming first and second P-N junctions therewith, respectively, which extend to the first sidewall;

a gate electrode in said trench; and a gate electrode insulating region lining the first and second sidewalls of said trench, said gate electrode insulating region having a first thickness less than about 750 Å as measured between said gate electrode and a first intersection between the first sidewall and the first P-N junction and a second thickness greater than about 1500 Å as measured between said gate electrode and a second intersection between the first sidewall and the second P-N junction.

42. The device of claim 41, further comprising a Schottky contact adjacent the first face, said Schottky contact forming a Schottky rectifying junction with a portion of said drift region extending opposite the second sidewall of said trench.

43. The device of claim 42, wherein said drift region has a graded first conductivity type doping concentration therein which decreases in a direction from said drain region to said base region.

44. The device of claim 43, wherein said drift region includes a uniformly doped region of first conductivity type therein extending adjacent the first face; and wherein said Schottky contact forms a Schottky rectifying junction with said uniformly doped region.

45. The device of claim 44, wherein a bottom of said trench defines an interface between said gate electrode insulating region and said drain region.

\* \* \* \* \*